(12) United States Patent
Jung et al.

(10) Patent No.: US 12,426,465 B2
(45) Date of Patent: Sep. 23, 2025

(54) DISPLAY DEVICE

(71) Applicant: Samsung Display Co., LTD., Yongin-si (KR)

(72) Inventors: Haegoo Jung, Hanam-si (KR); Sanghyun Lee, Hwaseong-si (KR); Yeon-Shil Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 327 days.

(21) Appl. No.: 18/103,354

(22) Filed: Jan. 30, 2023

(65) Prior Publication Data
US 2023/0309352 A1    Sep. 28, 2023

(30) Foreign Application Priority Data

Mar. 24, 2022   (KR) .................. 10-2022-0036814

(51) Int. Cl.
*H10K 59/131*  (2023.01)
*H10K 59/88*   (2023.01)
*H10K 59/122*  (2023.01)

(52) U.S. Cl.
CPC .......... *H10K 59/131* (2023.02); *H10K 59/88* (2023.02); *H10K 59/122* (2023.02)

(58) Field of Classification Search
CPC .................... H10K 59/131; H10K 59/88
See application file for complete search history.

(56) References Cited

U.S. PATENT DOCUMENTS

| 2019/0088733 | A1* | 3/2019 | Cho ............... H10K 59/873 |
| 2019/0173042 | A1* | 6/2019 | Lim ............... H10K 59/8723 |
| 2021/0320165 | A1  | 10/2021 | So et al. |
| 2022/0028956 | A1  | 1/2022 | You |

FOREIGN PATENT DOCUMENTS

| KR | 10-0685841 | 2/2007 |
| KR | 10-2272214 | 7/2021 |
| KR | 10-2021-0127276 A | 10/2021 |
| KR | 10-2022-0014365 A | 2/2022 |

* cited by examiner

*Primary Examiner* — Douglas M Menz
(74) *Attorney, Agent, or Firm* — Womble Bond Dickinson (US) LLP (57) ABSTRACT

A display device includes: a substrate including a display area, a bending area spaced apart from the display area, and a peripheral area between the display area and the bending area; a dummy pattern on the substrate in the peripheral area; a bank on the dummy pattern in the peripheral area and exposing a portion of the dummy pattern; and a light emitting diode on the substrate in the display area.

20 Claims, 12 Drawing Sheets

DISPLAY DEVICE

CROSS-REFERENCE TO RELATED APPLICATION(S)

The present application claims priority to and the benefit of Korean Patent Application No. 10-2022-0036814 filed on Mar. 24, 2022 in the Korean Intellectual Property Office (KIPO), the entire disclosure of which is incorporated herein by reference herein.

BACKGROUND

1. Field

Aspects of some embodiments relate to a display device.

2. Description of the Related Art

Cathode-ray tube (CRT) televisions have been widely used historically as a display device with various benefits in terms of performance and price. As technology has progressed, display devices which are smaller in size and lighter in weight and have better performance are being produced. For example, a plasma display device, a liquid crystal display device, an organic light emitting display device, a quantum dot display device, etc. are attracting attention. When the display device is corroded, display quality of the display device may deteriorate.

The above information disclosed in this Background section is only for enhancement of understanding of the background and therefore the information discussed in this Background section does not necessarily constitute prior art.

SUMMARY

Aspects of some embodiments relate to a display device. For example, some embodiments relate to an organic light emitting display device.

Aspects of some embodiments include a display device having relatively improved display quality.

A display device according to some embodiments may include a substrate including a display area, a bending area spaced apart from the display area, and a peripheral area between the display area and the bending area, a dummy pattern on the substrate in the peripheral area, a bank on the dummy pattern in the peripheral area and exposing a portion of the dummy pattern and a light emitting diode on the substrate in the display area.

According to some embodiments, the bank may cover another portion of the dummy pattern.

According to some embodiments, the dummy pattern may overlap an edge of the bank adjacent to the display area.

According to some embodiments, the dummy pattern may be electrically floating.

According to some embodiments, the display device may further include a first organic layer between the substrate and the bank and a second organic layer between the first organic layer and the bank, and the bank may cover the first organic layer and the second organic layer.

According to some embodiments, the second organic layer may cover the first organic layer.

According to some embodiments, the dummy pattern may be under the first organic layer and contact the first organic layer.

According to some embodiments, the dummy pattern may be between the first organic layer and the second organic layer.

According to some embodiments, the light emitting diode may include a pixel electrode, an intermediate layer on the pixel electrode, and common electrode on the intermediate layer, and the display device may further include a first connection electrode between the substrate and the light emitting diode, a first via insulation layer on the first connection electrode, a second connection electrode on the first connection electrode, a second via insulation layer between the second connection electrode and the pixel electrode and a pixel defining layer on the pixel electrode and exposing a portion of the pixel electrode.

According to some embodiments, the dummy pattern may include the same material as the first connection electrode.

According to some embodiments, the dummy pattern may include the same material as the second connection electrode.

According to some embodiments, the first organic layer may include the same material as the first via insulation layer.

According to some embodiments, the second organic layer may include the same material as the second via insulation layer.

According to some embodiments, the bank may include a third organic layer including the same material as the pixel defining layer and a fourth organic layer on the third organic layer.

According to some embodiments, the bank may extend from the peripheral area to the bending area and have an island shape.

According to some embodiments, the display device may further include a plurality of power lines crossing the bending area and the peripheral area and transmitting a driving voltage to the display area, and the bank may be between the plurality of power lines in a plan view.

According to some embodiments, the dummy pattern may be spaced apart from the plurality of power lines in a plan view.

According to some embodiments, the dummy pattern may include the same material as the plurality of power lines.

According to some embodiments, the display device may further include a plurality of fan-out lines crossing the bending area and the peripheral area and connected to the display area, and the bank may be on the plurality of fan-out lines.

According to some embodiments, the dummy pattern may overlap at least one of the plurality of fan-out lines.

In a display device according to some embodiments of the present invention, the display device may include a dummy pattern overlapping the plurality of fan-out lines. Even if cracks occur, the dummy pattern may prevent the plurality of fan-out lines from being corroded.

DETAILED DESCRIPTION

Hereinafter, display devices in accordance with some embodiments will be described in more detail with reference to the accompanying drawings. The same reference numerals are used for the same components in the drawings, and some redundant descriptions of the same components may be omitted.

Figure 1:
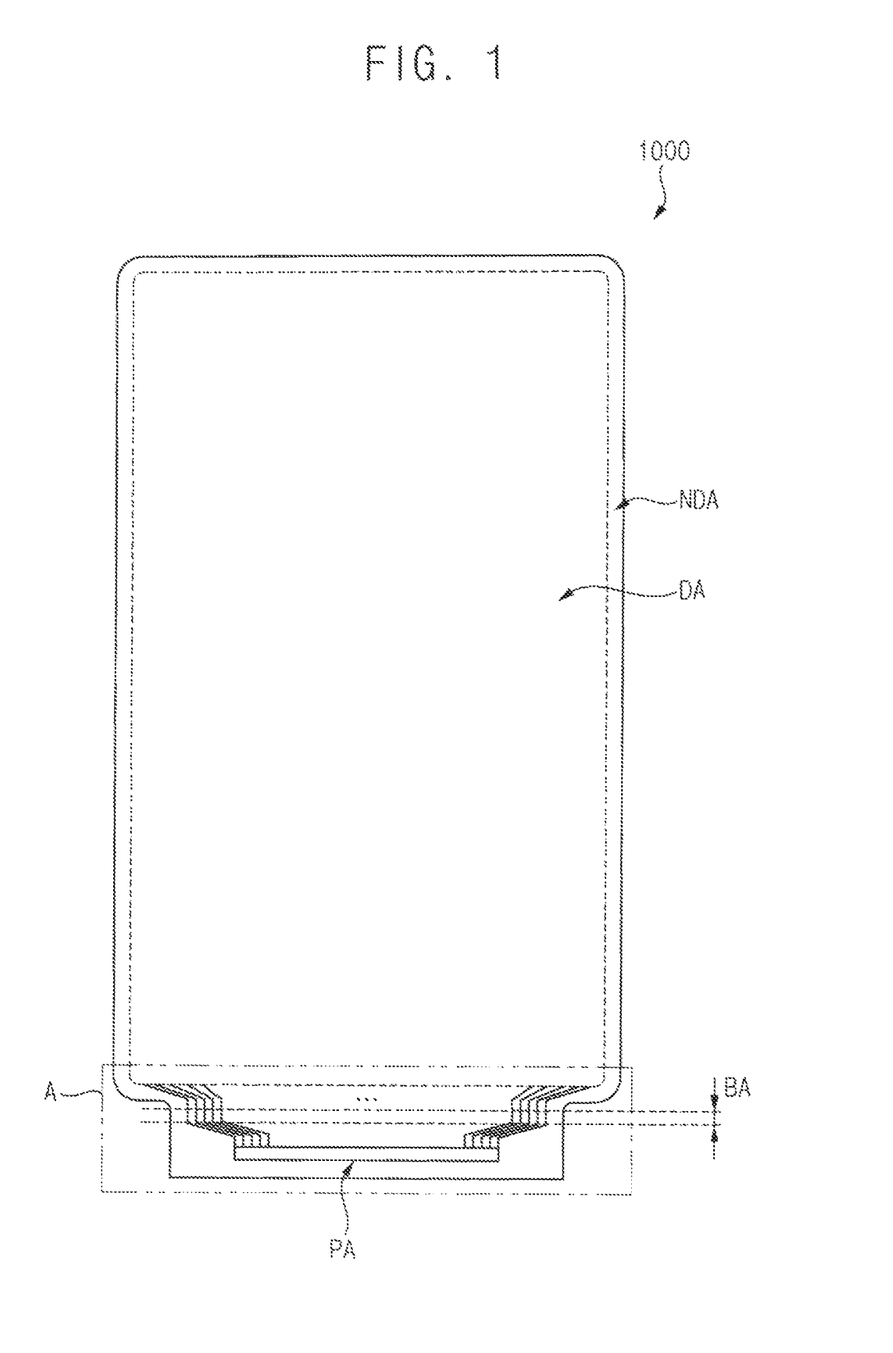
FIG. 1 is a plan view illustrating a display device according to some embodiments.

FIG. 1 is a plan view illustrating a display device according to some embodiments.

Referring to FIG. 1, a display device 1000 according to some embodiments may include a display area DA and a non-display area NDA.

A plurality of pixels may be located in the display area DA. The pixels may emit light. The display area DA may display images.

The non-display area NDA may surround at least a portion of the display area DA. For example, according to some embodiments, the non-display area NDA may be located in a periphery of the display area DA. The non-display area NDA may not display images. The non-display area NDA may include a pad area PA spaced apart from the display area DA and a bending area BA located between the display area DA and the pad area PA.

A driver may be located in the pad area PA. The driver may provide a signal and a voltage to the pixel. The pixel may emit the light based on the signal and the voltage. For example, the driver may include a data driver or the like.

The display device 1000 may be bent in the bending area BA. The driver may not be viewed in a plan view (e.g., a view perpendicular or normal with respect to a display surface) of the display device 1000 as the bending area BA is bent.

The display device 1000 may include an organic light emitting display device, an inorganic light emitting display device, a quantum dot light emitting display device, a micro LED display device, a nano LED display device, a plasma display device, a liquid crystal display device, and the like.

Figure 2:
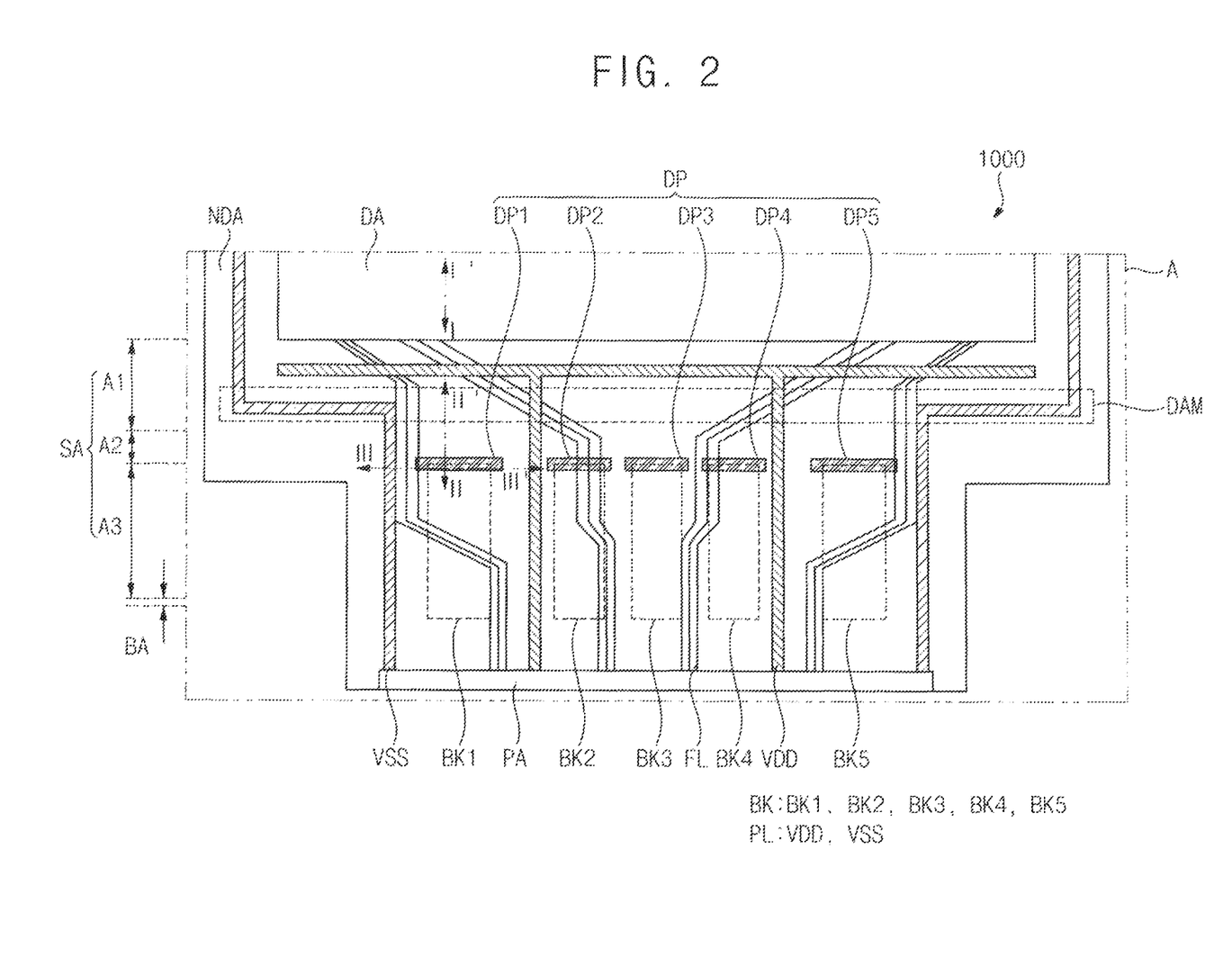
FIG. 2 is an enlarged view illustrating an area CA' of FIG. 1.

FIG. 2 is an enlarged view illustrating the area 'A' of FIG. 1.

Referring to FIG. 2, the non-display area NDA may surround a portion of the display area DA. The non-display area NDA may include a pad area PA, a bending area BA, and a peripheral area SA.

The peripheral area SA may be located between the display area DA and the bending area BA. The peripheral area SA may include a first area A1, a second area A2, and a third area A3. The first area A1 may be adjacent to the display area DA. The third area A3 may be adjacent to the bending area BA. The second area A2 may be located between the first area A1 and the third area A3.

The display device 1000 may include a plurality of fan-out lines FL, a plurality of power lines PL, a dam DAM, a bank BK, and a dummy pattern DP.

The plurality of fan-out lines FL may cross the bending area BA, the first area A1, the second area A2, and the third area A3. The plurality of fan-out lines FL may electrically connect the pad area PA and the display area DA. The plurality of fan-out lines FL may transmit a data signal from the driver located in the pad area PA to the data line located in the display area DA. The data line may provide the data signal to the pixel.

The plurality of power lines PL may cross the bending area BA, the first area A1, the second area A2, and the third area A3. The plurality of power lines PL may electrically connect the pad area PA and the display area DA. The plurality of power lines PL may transmit a driving voltage from the driver located in the pad area PA to the pixel located in the display area DA. The plurality of power lines PL may include a first power line VDD and a second power line VSS.

The first power line VDD may transmit a relatively high driving voltage from the driver to the pixel. The second power line VSS may transmit a relatively low driving voltage from the driver to the pixel.

The dam DAM may be located in the first area A1. The dam DAM may prevent or reduce instances of the monomer located in the display area DA overflowing into the non-display area NDA. The dam DAM may include an organic material.

The bank BK may extend from the peripheral area SA to the bending area BA. For example, the bank BK may be located in the third area A3 and the bending area BA. The bank BK may have an island shape. A portion of the bank BK may be further located between the bending area BA and the pad area PA.

The bank BK may include a first bank BK1, a second bank BK2, a third bank BK3, a fourth bank BK4, and a fifth bank BK5. Although the bank BK is illustrated as being composed of five, the number of the banks BK is not limited thereto. The bank BK may be configured in various numbers. Although the bank BK is shown as a rectangle, the shape of the bank BK is not limited thereto, and the bank BK may include any suitable shape according to the design of the display device 1000. The bank BK may include an organic material.

The bank BK may be located between the plurality of power lines PL in a plan view. The bank BK may be spaced apart from the plurality of power lines PL in a plan view.

The bank BK may be located on the plurality of fan-out lines FL. The bank BK may overlap the plurality of fan-out lines FL.

A mask may be used during a manufacturing process of the display device 1000. When the mask sags, the mask may contact the display device 1000. The mask may contact the display device 1000 to generate static electricity. The bank BK may support the mask and prevent or reduce sagging of the mask.

The dummy pattern DP may overlap an end of the bank BK. The dummy pattern DP may overlap the bank BK in the third area A3. A portion of the dummy pattern DP may be located in the second area A2. The dummy pattern DP may overlap an edge of the bank BK adjacent to the display area DA. The dummy pattern DP may include a metal.

The dummy pattern DP may include a first dummy pattern DP1, a second dummy pattern DP2, a third dummy pattern DP3, a fourth dummy pattern DP4, and a fifth dummy pattern DP5. Although the dummy pattern DP is illustrated as being composed of five, the number of the dummy patterns DP is not limited, and the number of dummy patterns DP may vary according to the design of the display device 1000. For example, the number of the dummy patterns DP may be substantially the same as that of the banks BK. Although the dummy pattern DP is illustrated as being a rectangle, the shape of the dummy pattern DP is not limited thereto.

According to some embodiments, the dummy pattern DP may be located between the plurality of power lines PL. The dummy pattern DP may be spaced apart from the plurality of power lines PL in a plan view. For example, the dummy pattern DP may not contact the plurality of power lines PL.

According to some embodiments, the dummy pattern DP may be located on the plurality of fan-out lines FL. The dummy pattern DP may overlap the at least one of the plurality of fan-out lines FL. However, embodiments according to the present invention are not limited thereto, and the dummy pattern DP may not contact the plurality of fan-out lines FL.

According to some embodiments, the dummy pattern DP may be electrically floating. Because the dummy pattern DP does not contact the plurality of power lines PL and the plurality of data lines DL, the dummy pattern DP may not transmit the signals and/or voltages. For example, the dummy pattern DP may not transmit the data signal and/or the driving voltage.

The dam DAM including an organic material may be located in the first area A1 of the peripheral area SA, and the bank BK including an organic material may be located in the third area A3 of the peripheral area SA. The dam DAM and the bank BK including the organic material may not be located in the second area A2 of the peripheral area SA. The second area A2 may be an area in which an organic material is not located.

Figure 3:
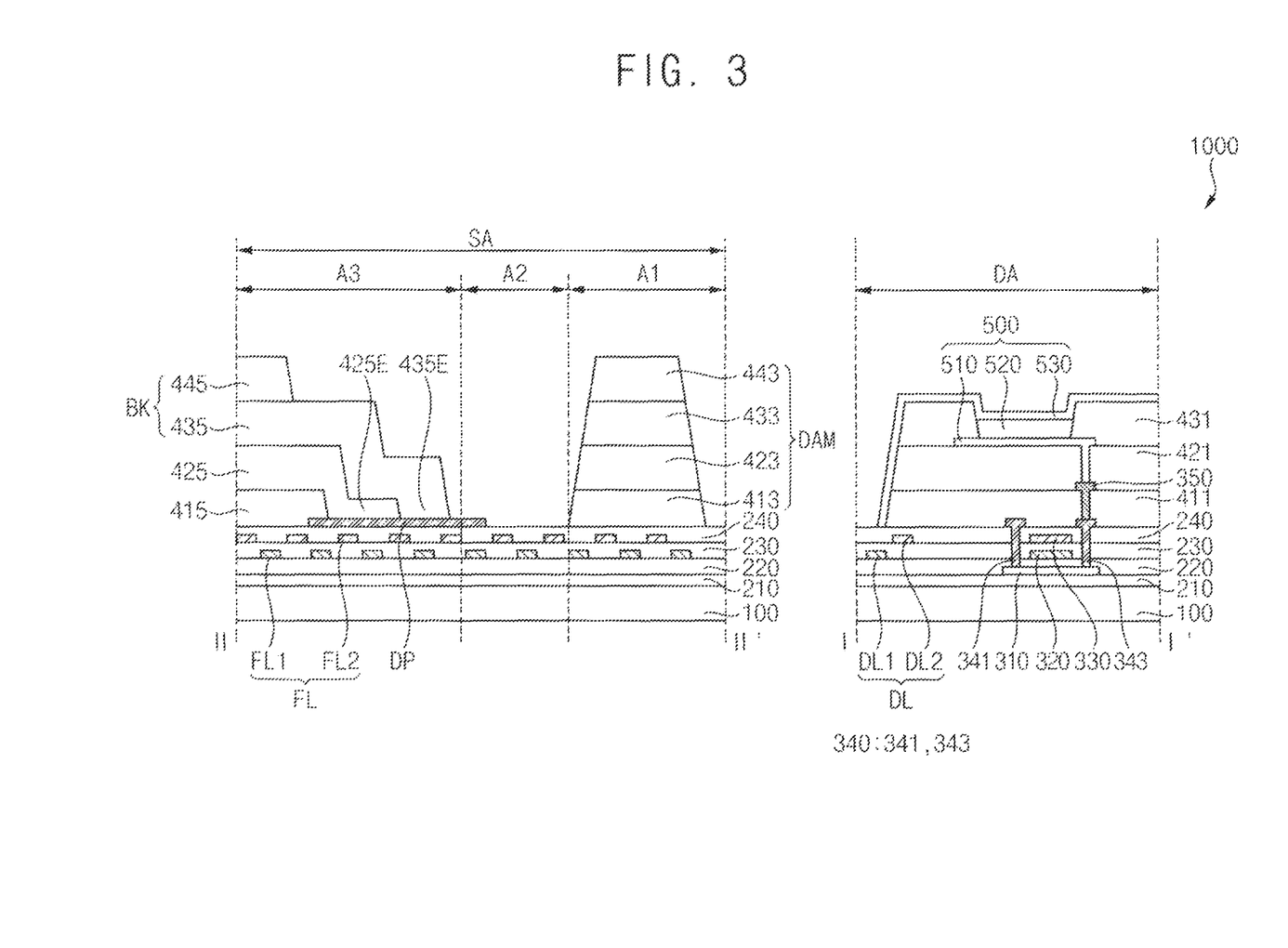
FIG. 3 is a cross-sectional view taken along the lines I-I' and II-II' of FIG. 2.

FIG. 3 is a cross-sectional view taken along the lines I-I' and II-II' of FIG. 2.

Referring to FIG. 3, the display device 1000 may include a substrate 100, a buffer layer 210, an active pattern 310, a gate insulation layer 220, a gate electrode 320, a first interlayer insulation layer 230, a capacitor electrode 330, the data line DL, a second interlayer insulation layer 240, a first connection electrode 340, a first via insulation layer 411, a second connection electrode 350, a second via insulation layer 421, a light emitting diode 500, a pixel defining layer 431, the plurality of fan-out lines FL, the dam DAM, a first organic layer 415, a second organic layer 425, the bank BK, and the dummy pattern DP.

Referring to FIGS. 2 and 3, the substrate 100 may include a display area DA, a peripheral area SA, a bending area BA, and a pad area PA. The substrate 100 may be continuously located in the display area DA, the peripheral area SA, the bending area BA, and the pad area PA.

For example, the substrate 100 may be a flexible substrate including polyimide or the like. The flexible substrate may have a structure in which a polyimide layer and a barrier layer are alternately stacked. For another example, the substrate 100 may be a rigid substrate including quartz, glass, or the like.

The buffer layer 210 may be located on the substrate 100. The buffer layer 210 may be continuously located in the display area DA, the peripheral area SA, and the bending area BA. The buffer layer 210 may prevent diffusion of metal atoms or impurities from the substrate 100 into the active pattern 310. The buffer layer 210 may control a heat supply rate during a crystallization process of forming the active pattern 310. The buffer layer 210 may include an inorganic material. Examples of the inorganic material may include silicon oxide, silicon nitride, silicon oxynitride, and the like. These may be used alone or in combination with each other.

The active pattern 310 may be located on the buffer layer 210. The active pattern 310 may be located in the display area DA. The active pattern 310 may include a silicon semiconductor or an oxide semiconductor. Examples of the silicon semiconductor may include amorphous silicon and polycrystalline silicon.

The gate insulation layer 220 may be located on the active pattern 310 and may cover the active pattern 310. The gate insulation layer 220 may be continuously located in the display area DA, the peripheral area SA, and the bending area BA. The gate insulation layer 220 may include an inorganic material. Examples of the inorganic material may include silicon oxide, silicon nitride, silicon oxynitride, and the like. These may be used alone or in combination with each other.

The gate electrode 320 may be located on the gate insulation layer 220. The gate electrode 320 may be located in the display area DA. The gate electrode 320 may overlap the active pattern 310. The gate electrode 320 may include a metal, a metal oxide, a metal nitride, or the like. Examples of the metal may include silver, molybdenum, aluminum, tungsten, copper, nickel, chromium, titanium, tantalum, platinum, and scandium. Examples of the metal oxide may include indium tin oxide (ITO), indium zinc oxide (IZO), and the like. Examples of the metal nitride may include aluminum nitride, tungsten nitride, and chromium nitride. These may be used alone or in combination with each other.

The first interlayer insulation layer 230 may be located on the gate electrode 320 and may cover the gate electrode 320. The first interlayer insulation layer 230 may be continuously located in the display area DA, the peripheral area SA, and the bending area BA. The first interlayer insulation layer 230 may include an inorganic material. Examples of the inorganic material may include silicon oxide, silicon nitride, silicon oxynitride, and the like. These may be used alone or in combination with each other.

The capacitor electrode 330 may be located on the first interlayer insulation layer 230. The capacitor electrode 330 may be located in the display area DA. The capacitor electrode 330 may overlap the gate electrode 320. The capacitor electrode 330 and the gate electrode 320 may constitute a capacitor, but embodiments according to the present disclosure are not limited thereto. The capacitor electrode 330 may include a metal, a metal oxide, a metal nitride, or the like. For example, the capacitor electrode 330 may include substantially the same material as the gate electrode 320.

The data line DL may include a first data line DL1 and a second data line DL2. The first data line DL1 may be located between the gate insulation layer 220 and the first interlayer insulation layer 230. The first data line DL1 may include substantially the same material as the gate electrode 320. The second data line DL2 may be located between the first interlayer insulation layer 230 and the second interlayer insulation layer 240. The second data line DL2 may include substantially the same material as the capacitor electrode 330. The data line DL may receive the data signal from the plurality of fan-out lines FL. The data line DL may provide the data signal to the pixel.

The second interlayer insulation layer 240 may be located on the capacitor electrode 330 and may cover the capacitor electrode 330. The second interlayer insulation layer 240 may be continuously arranged in the display area DA, the peripheral area SA, and the bending area BA. The second interlayer insulation layer 240 may include an inorganic material. Examples of the inorganic material may include silicon oxide, silicon nitride, silicon oxynitride, and the like. These may be used alone or in combination with each other.

The first connection electrode 340 may be located on the second interlayer insulation layer 240. The first connection electrode 340 may be located in the display area DA. The first connection electrode 340 may include a source electrode 341 and a drain electrode 343. The first connection electrode 340 may be electrically connected to the active pattern 310 through a contact hole. The first connection electrode 340 may include a metal, a metal oxide, a metal nitride, or the like. Examples of the metal may include silver, molybdenum, aluminum, tungsten, copper, nickel, chromium, titanium, tantalum, platinum, and scandium. Examples of the metal oxide may include indium tin oxide (ITO), indium zinc oxide (IZO), and the like. Examples of the metal nitride may include aluminum nitride, tungsten nitride, and chromium nitride. These may be used alone or in combination with each other.

The first via insulation layer 411 may be located on the first connection electrode 340 and may cover the first connection electrode 340. The first via insulation layer 411 may be continuously arranged in the display area DA, the peripheral area SA, and the bending area BA. The first via insulation layer 411 may include an organic material. Examples of the organic material include photoresists, polyacrylic resins, and polyimide resins. These may be used alone or in combination with each other.

The second connection electrode 350 may be located on the first via insulation layer 411. The second connection electrode 350 may be located in the display area DA. The second connection electrode 350 may be electrically connected to the first connection electrode 340 through a contact hole. The second connection electrode 350 may include a metal, a metal oxide, a metal nitride, or the like. Examples of the metal may include silver, molybdenum, aluminum, tungsten, copper, nickel, chromium, titanium, tantalum, platinum, and scandium. Examples of the metal oxide may include indium tin oxide (ITO), indium zinc oxide (IZO), and the like. Examples of the metal nitride may include aluminum nitride, tungsten nitride, and chromium nitride. These may be used alone or in combination with each other.

The second via insulation layer 421 may be located on the second connection electrode 350 and may cover the second connection electrode 350. The second via insulation layer 421 may be continuously formed in the display area DA, the peripheral area SA, and the bending area BA. The first via insulation layer 411 may include an organic material. Examples of the organic material may include photoresists, polyacrylic resins, and polyimide resins. These may be used alone or in combination with each other.

The light emitting diode 500 may include a pixel electrode 510, an intermediate layer 520, and a common electrode 530.

The pixel electrode 510 may be located on the second via insulation layer 421. The pixel electrode 510 may be located in the display area DA. The pixel electrode 510 may be electrically connected to the second connection electrode 350 through a contact hole. The pixel electrode 510 may include a metal, a metal oxide, a metal nitride, or the like.

The pixel defining layer 431 may be located on the pixel electrode 510. The pixel defining layer 431 may be located in the display area DA. The pixel defining layer 431 may cover an end of the pixel electrode 510. The pixel defining layer 431 may include an opening exposing at least a portion of the pixel electrode 510. The pixel defining layer 431 may include an organic material. Examples of the organic material may include photoresists, polyacrylic resins, and polyimide resins. These may be used alone or in combination with each other.

The intermediate layer 520 may be located on the pixel electrode 510. The intermediate layer 520 may be located in the opening of the pixel defining layer 431. The intermediate layer 520 may be located in the display area DA. The intermediate layer 520 may include an organic material emitting light of a preset color. For example, the organic material may emit red, green, blue, or white light based on a potential difference between the pixel electrode 510 and the common electrode 530.

The common electrode 530 may be located on the intermediate layer 520 and may cover the intermediate layer 520. The common electrode 530 may cover the pixel defining layer 431. The common electrode 530 may include a transparent conductive material.

The plurality of fan-out lines FL may be located in the peripheral area SA. The plurality of fan-out lines FL may include a first fan-out line FL1 and a second fan-out line FL2 located on the first fan-out line FL1. The second fan-out line FL2 may not overlap the first fan-out line FL1. The first fan-out line FL1 and the second fan-out line FL2 may be alternately arranged, but embodiments according to the present disclosure are not limited thereto. The plurality of fan-out lines FL may include a metal, a metal oxide, or a metal nitride.

The first fan-out line FL1 may be located between the gate insulation layer 220 and the first interlayer insulation layer 230. The first fan-out line FL1 may include substantially the same material as the gate electrode 320.

The second fan-out line FL2 may be located between the first interlayer insulation layer 230 and the second interlayer insulation layer 240. The second fan-out line FL2 may include substantially the same material as the capacitor electrode 330.

The dam DAM may be located on the substrate 100 in the peripheral area SA. The dam DAM may be located in the first area A1. The dam DAM may include a first dam 413, a second dam 423, a third dam 433, and a fourth dam 443. According to some embodiments, the dam DAM may prevent or reduce overflowing of the monomer of the thin film encapsulation layer located on the display area DA into the non-display area NDA. The dam DAM may include an organic material.

The first dam DAM1 may be located on the second interlayer insulation layer 240. The first dam DAM1 may include the same, or substantially the same, material as the first via insulation layer 411.

The second dam DAM2 may be located on the first dam DAM1. The second dam DAM2 may include the same, or substantially the same, material as the second via insulation layer 421.

The third dam DAM3 may be located on the second dam DAM2. The third dam DAM3 may include the same, or substantially the same, material as the pixel defining layer 431.

The fourth dam DAM4 may be located on the third dam DAM3. The fourth dam DAM4 may include an organic material. Examples of the organic material may include photoresists, polyacrylic resins, and polyimide resins. These may be used alone or in combination with each other.

The first organic layer 415 may be located on the second interlayer insulation layer 240. The first organic layer 415 may include the same, or substantially the same, material as the first via insulation layer 411 and/or the first dam 413.

The second organic layer 425 may be located on the first organic layer 415 and may cover the first organic layer 415. The second organic layer 425 may include the same, or substantially the same, material as the second via insulation layer 421 and/or the second dam 423.

The bank BK may be located on the substrate 100 in the peripheral area SA. The bank BK may be located in the third area A3. The bank BK may include a third organic layer 435 and a fourth organic layer 445. According to some embodiments, the bank BK may support the mask and prevent or reduce sagging of the mask. The bank BK may include an organic material.

The third organic layer 435 may be located on the second organic layer 425 and may cover the second organic layer 425. The third organic layer 435 may include substantially the same material as the pixel defining layer 431 and/or the third dam 433.

The fourth organic layer 445 may be located on the third organic layer 435. The fourth organic layer 445 may expose the third organic layer 435. The fourth organic layer 445 may not cover the third organic layer 435. The fourth organic layer 445 may include substantially the same material as the fourth dam DAM4.

The dummy pattern DP may be located between the substrate 100 and the third organic layer 435 in the peripheral area SA. The dummy pattern DP may be located in the third area A3. A portion of the dummy pattern DP may be located in the second area A2.

According to some embodiments, the dummy pattern DP may be located between the second interlayer insulation layer 240 and the first organic layer 415. The dummy pattern DP may contact the first organic layer 415. The dummy pattern DP may include the same (or substantially the same) material as the first connection electrode 340. The dummy pattern DP may include the same (or substantially the same) material as the plurality of power lines PL.

The dummy pattern DP may extend from the third area A3 to the second area A2. The first organic layer 415, the second organic layer 425, and the third organic layer 435 may overlap the dummy pattern DP. At least a portion of the dummy pattern DP may not overlap the first organic layer 415, the second organic layer 425, and the third organic layer 435.

According to some embodiments, the portion of the dummy pattern DP may be exposed by the third organic layer 435. The portion of the dummy pattern DP may not overlap the third organic layer 435. The third organic layer 435 may cover another portion of the dummy pattern DP. The third organic layer 435 may not entirely cover the dummy pattern DP. For example, the dummy pattern DP may overlap an end portion 435E of the third organic layer 435. The dummy pattern DP may overlap the at least one of plurality of fan-out lines FL.

A crack may occur along the end portion 435E of the third organic layer 435. For example, the crack may occur along a boundary of an edge of the third organic layer 435 adjacent to the display area DA. When the crack occurs, corrosion may occur in the plurality of fan-out lines FL overlapping the crack. When the corrosion occurs, the display quality of the display device 1000 may be deteriorated.

Even when the crack occurs, the dummy pattern DP may prevent or reduce corrosion of the plurality of fan-out lines FL. Because the display device 1000 includes the dummy pattern DP, the display quality of the display device 1000 may be improved.

Figure 4:
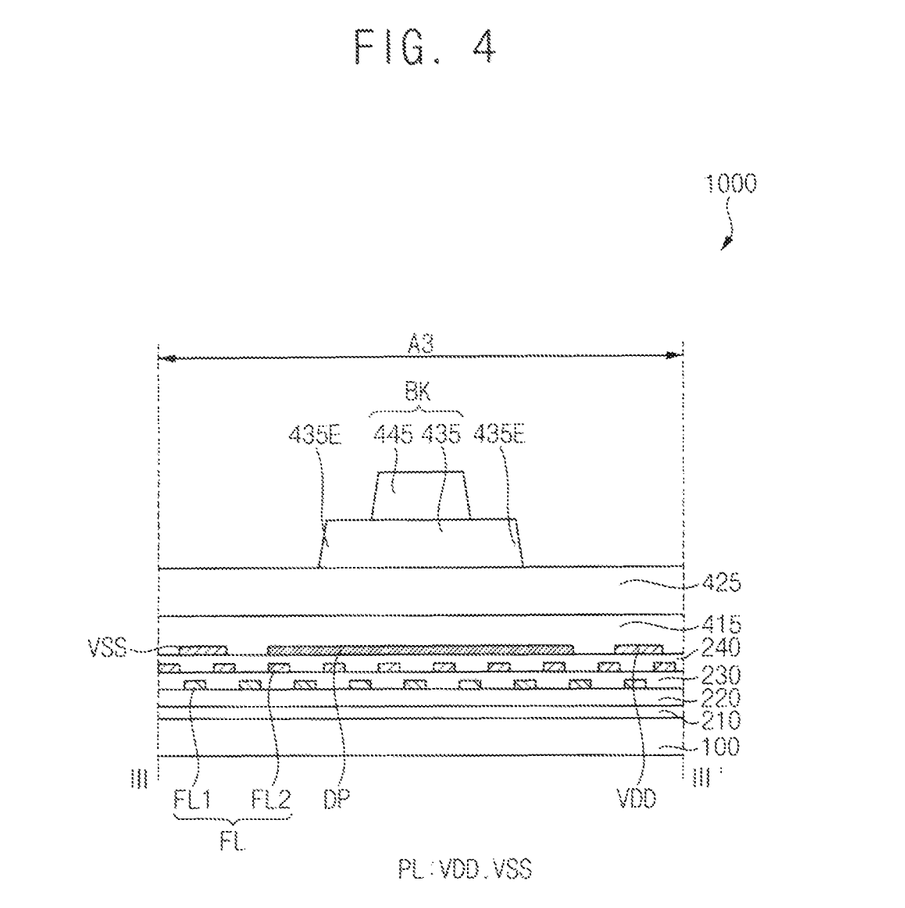
FIG. 4 is a cross-sectional view taken along the line III-III' of FIG. 2.

FIG. 4 is a cross-sectional view taken along the line III-III' of FIG. 2.

Referring to FIG. 4, for example, the plurality of power lines PL may be located between the second interlayer insulation layer 240 and the first organic layer 415. According to some embodiments, the plurality of power lines PL may be located between the first organic layer 415 and the second organic layer 425.

According to some embodiments, the dummy pattern DP may be located between the plurality of power lines PL. For example, the dummy pattern DP may be located between the first power line VDD and the second power line VSS. The dummy pattern DP may be spaced apart from the plurality of power lines PL in a plan view. The dummy pattern DP may be electrically floating. The dummy pattern DP may include substantially the same material as the plurality of power lines PL.

FIGS. 5 to 10 are views illustrating a method of manufacturing the display device of FIG. 3.

Figure 5:
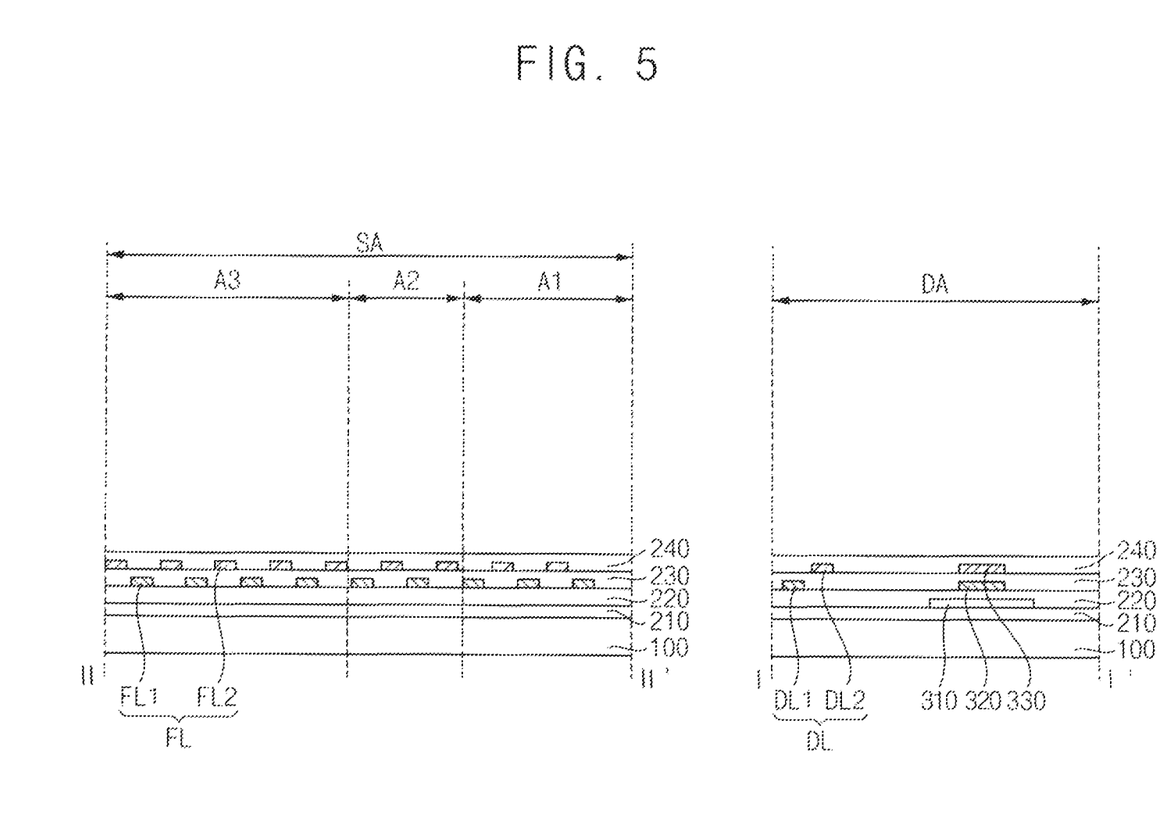
FIGS. 5 to 10 are views illustrating a method of manufacturing the display device of FIG. 3.

Referring to FIG. 5, a substrate 100 may be provided. A buffer layer 210 may be continuously formed on the substrate 100 in the display area DA and the peripheral area SA. An active pattern 310 may be formed on the buffer layer 210 in the display area DA. A gate insulation layer 220 may be continuously formed on the active pattern 310 in the display area DA and the peripheral area SA. A gate electrode 320 may be formed on the gate insulation layer 220 to overlap the active pattern 310 in the display area DA. A first data line DL1 may be formed on the gate insulation layer 220 to be spaced apart from the gate electrode 320 in the display area DA. A first fan-out line FL1 may be formed on the gate insulation layer 220 in the peripheral area SA. The gate electrode 320, the first data line DL1, and the first data line DL1 may be formed substantially simultaneously, and may include the same (or substantially the same) material. A first interlayer insulation layer 230 may be continuously formed on the gate electrode 320 and the first data line DL1 in the display area DA and the peripheral area SA. A capacitor electrode 330 may be formed on the first interlayer insulation layer 230 to overlap the gate electrode 320 in the display area DA. A second data line DL2 may be formed on the first interlayer insulation layer 230 to be spaced apart from the capacitor electrode 330 in the display area DA. A second fan-out line FL2 may be formed on the first interlayer insulation layer 230 so as not to overlap the first data line DL1 in the peripheral area SA. The capacitor electrode 330, the second data line DL2, and the second fan-out line FL2 may be formed substantially simultaneously and may include the same (or substantially the same) material. A second interlayer insulation layer 240 may be continuously formed on the capacitor electrode 330, the second data line DL2, and the second fan-out line FL2 in the display area DA and the peripheral area SA.

Figure 6:
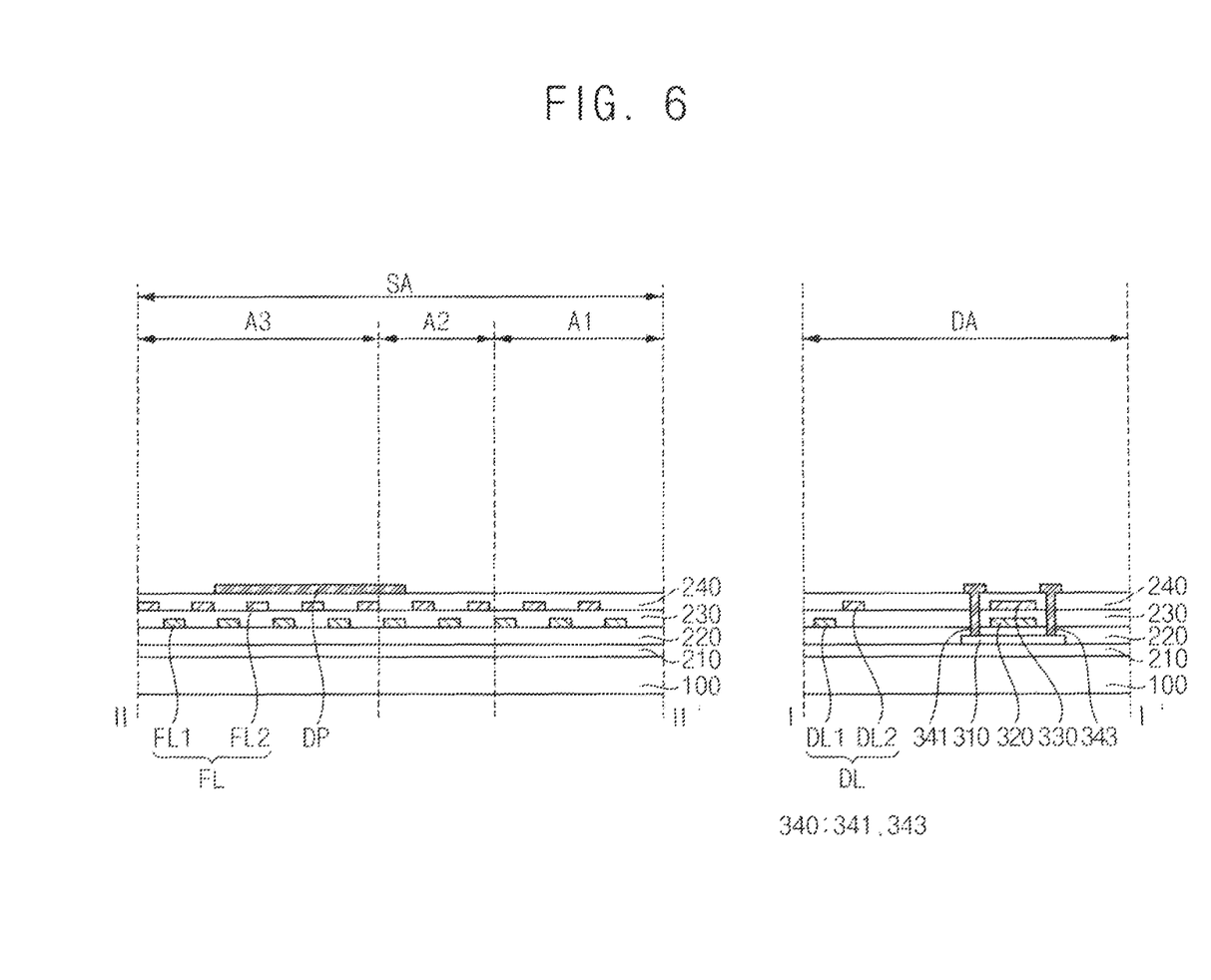

Referring to FIG. 6, a first connection electrode 340 may be formed on the second interlayer insulation layer 240 in the display area DA. a dummy pattern DP may be formed on the second interlayer insulation layer 240 to overlap the plurality of fan-out lines FL in the second area A2 and the third area A3. The first connection electrode 340 and the dummy pattern DP may be formed substantially simultaneously or concurrently and may include the same (or substantially the same) material.

Figure 7:
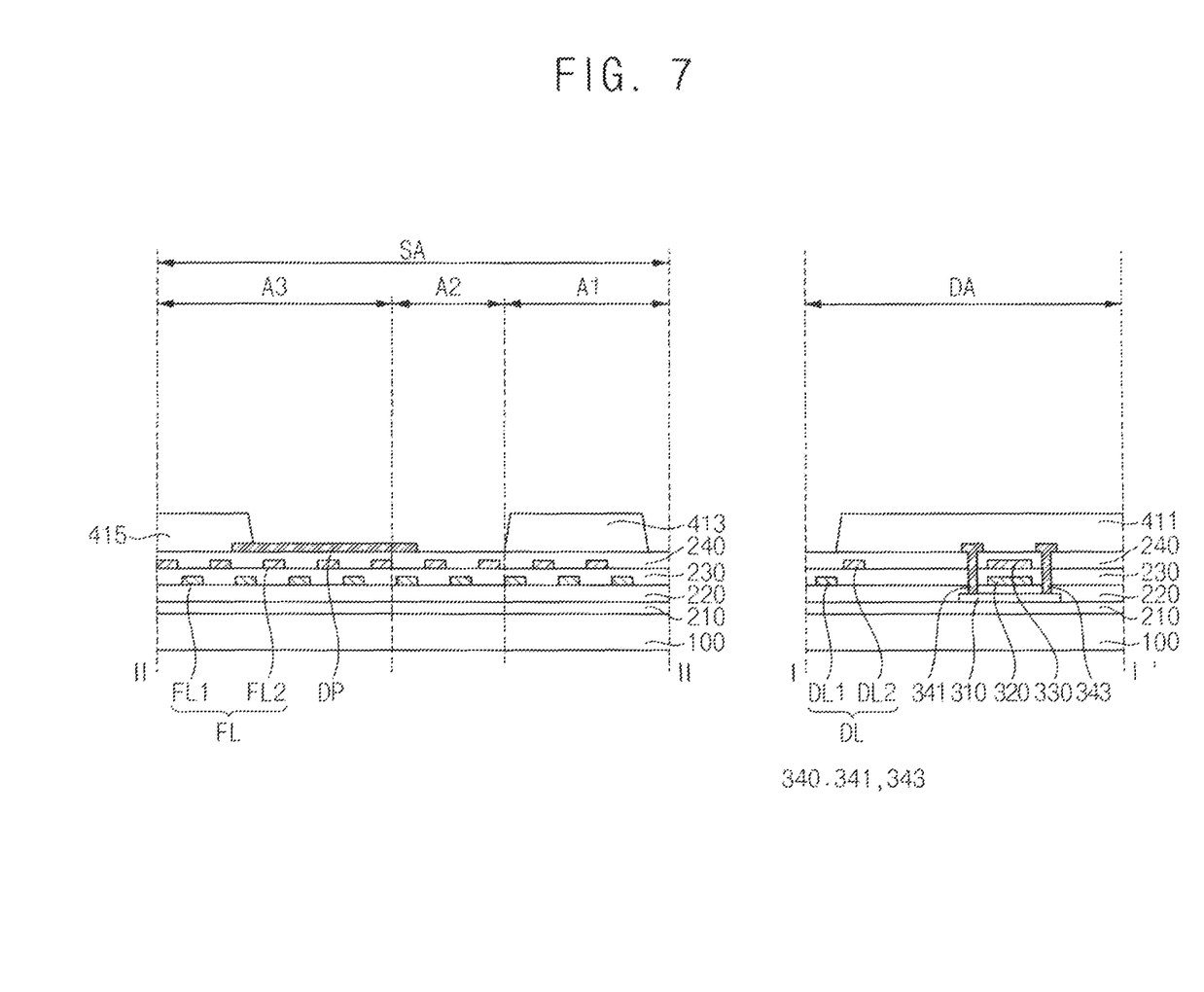

Referring to FIG. 7, a first via insulation layer 411 may be formed on the first connection electrode 340 in the display area DA. A first dam 413 may be formed on the second interlayer insulation layer 240 in the first area A1. A first organic layer 415 may be formed on the dummy pattern DP in the third area A3. The first organic layer 415 may be formed to cover a portion of the dummy pattern DP. The first via insulation layer 411, the first dam 413, and the first organic layer 415 may be formed substantially simultaneously or concurrently and may include the same (or substantially the same) material.

Figure 8:
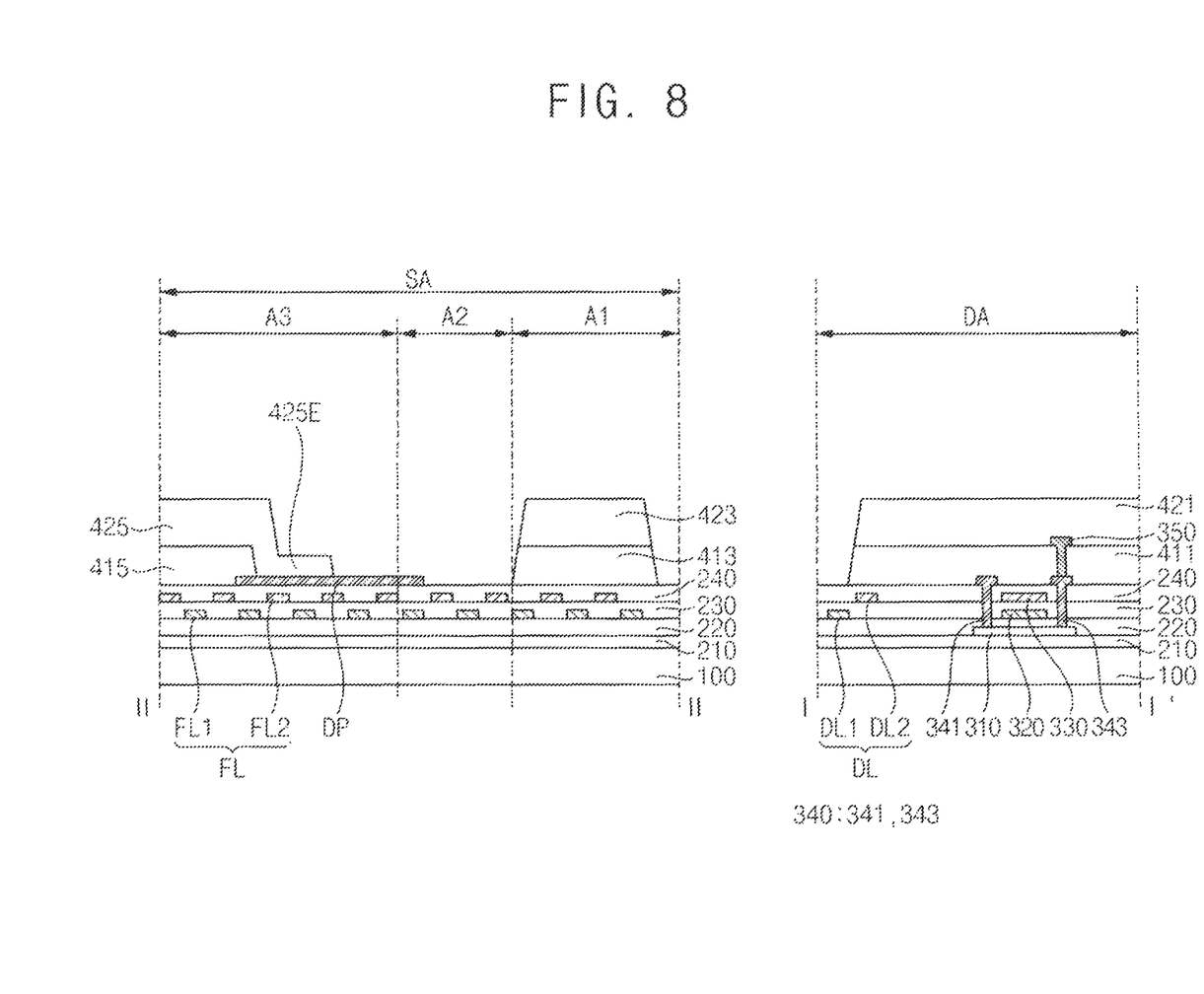

Referring to FIG. 8, a second via insulation layer 421 may be formed on the first via insulation layer 411 in the display area DA. A second dam 423 may be formed on the first dam 413 in the first area A1. A second organic layer 425 may be formed on the first organic layer 415 in the third area A3.

The second organic layer 425 may include an end portion 425E having a relatively small thickness by being formed using a halftone mask. The second organic layer 425 may be formed to cover another portion of the dummy pattern DP. The second via insulation layer 421, the second dam 423, and the second organic layer 425 may be formed substantially simultaneously or concurrently and may include the same (or substantially the same) material.

Figure 9:
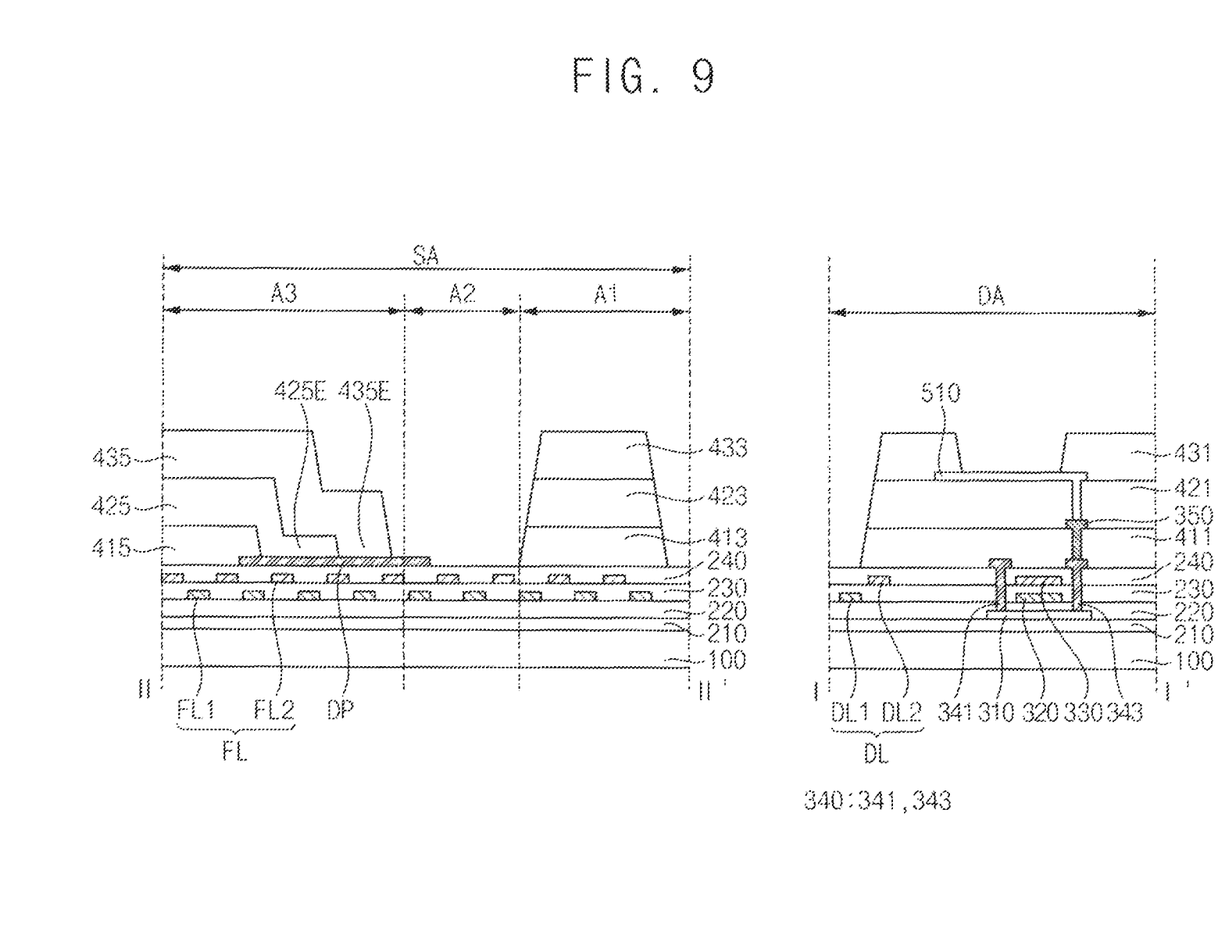

Referring to FIG. 9, a pixel electrode 510 may be formed on the second via insulation layer 421 in the display area DA. A pixel defining layer 431 may be formed on the pixel electrode 510 in the display area DA. A third dam 433 may be formed on the second dam 423 in the first area A1. The third organic layer 435 may be formed on the second organic layer 425 in the third area A3. The third organic layer 435 may be formed to cover further another portion of the dummy pattern DP. The third organic layer 435 may be formed to expose the dummy pattern DP. The pixel defining layer 431, the third dam 433, and the third organic layer 435 may be formed substantially simultaneously or concurrently and may include the same (or substantially the same) material.

Figure 10:
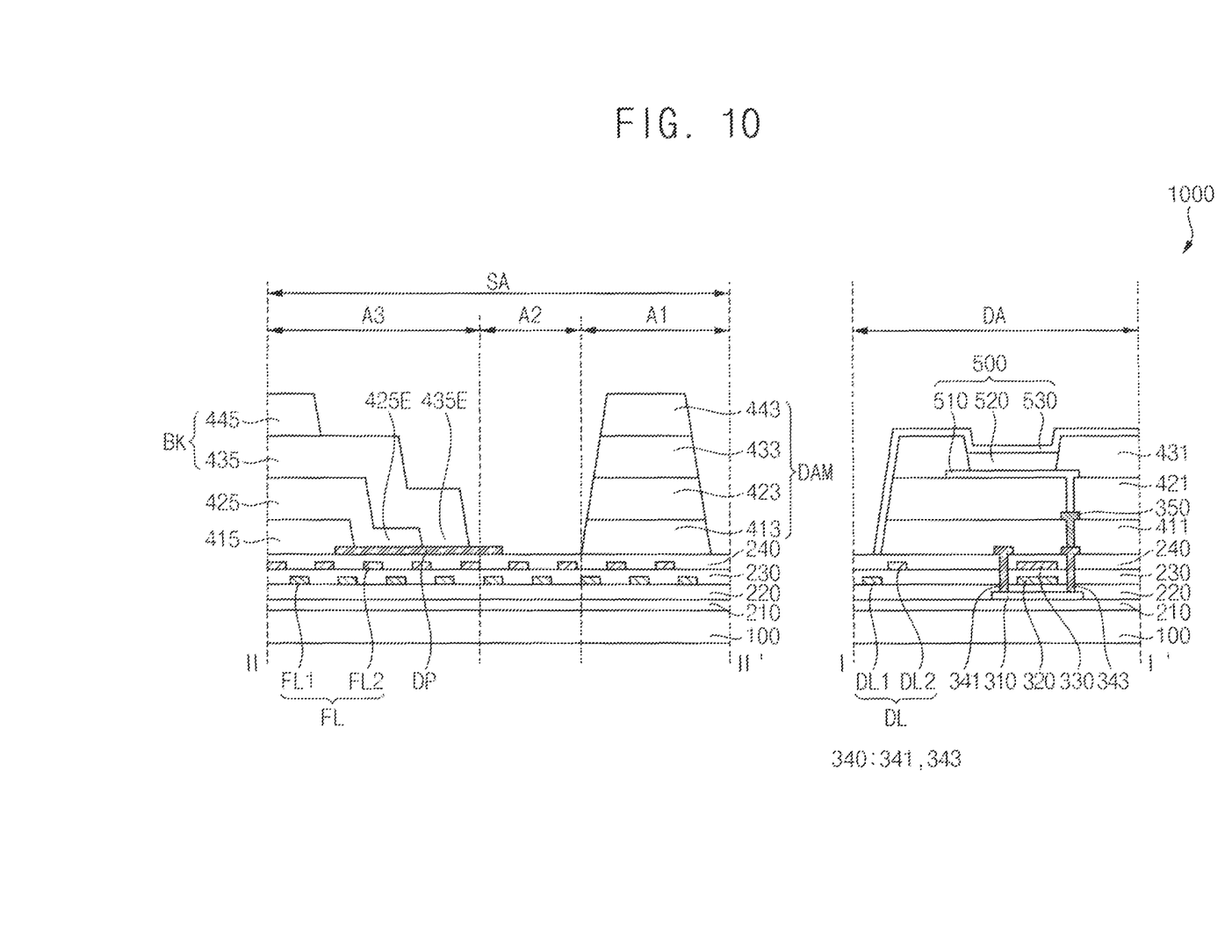

Referring to FIG. 10, an intermediate layer 520 may be formed on the pixel electrode 510 in the display area DA. A common electrode 530 may be formed on the intermediate layer 520 in the display area DA. A fourth dam 443 may be formed on the third dam 433 in the first area A1. The fourth organic layer 445 may be formed on the third organic layer 435 in the third area A3. The fourth dam 443 and the fourth organic layer 445 may be formed substantially simultaneously or concurrently and may include the same (or substantially the same) material.

Figure 11:
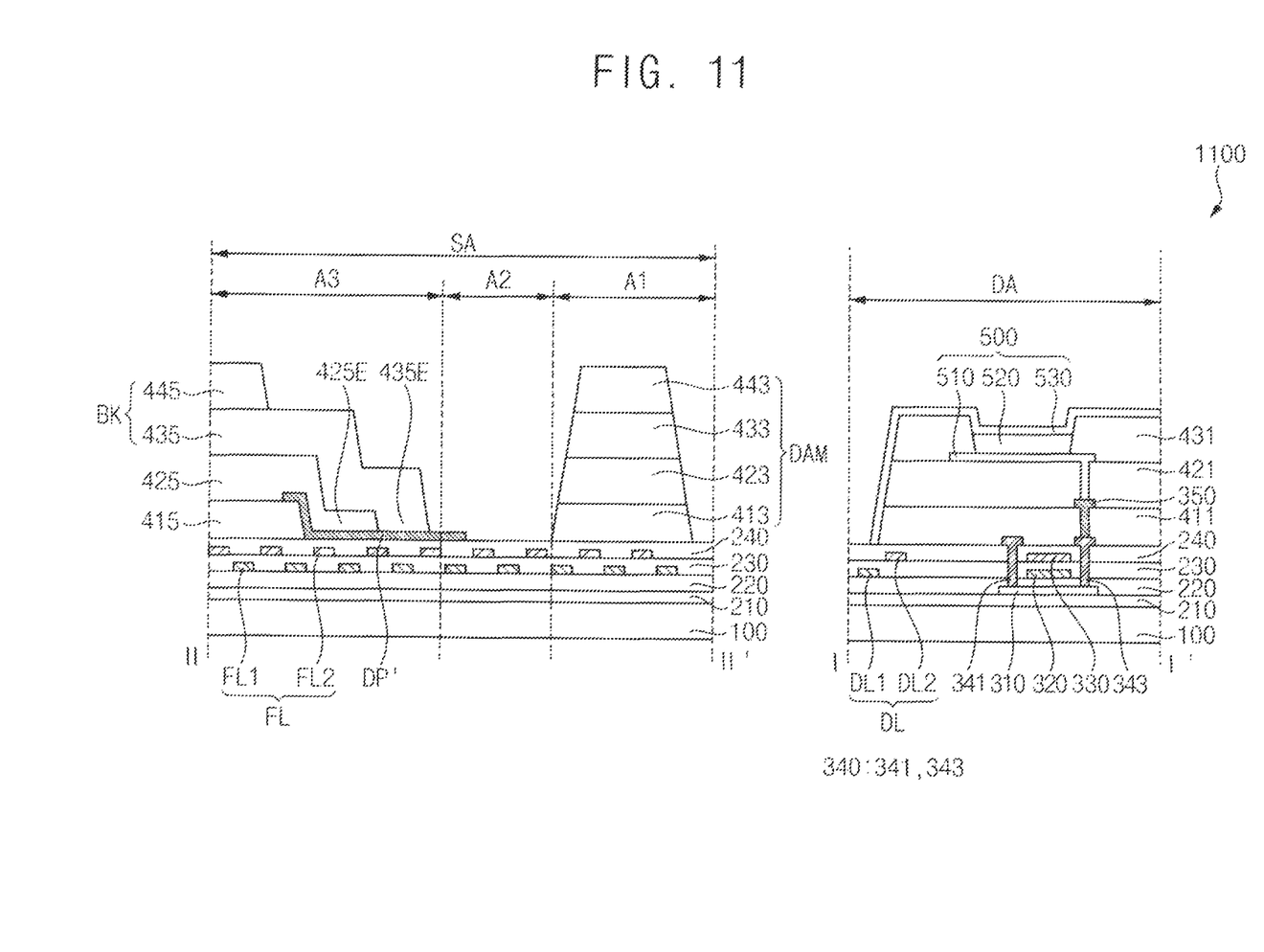
FIGS. 11 and 12 are cross-sectional views illustrating a display device according to some embodiments.
Figure 12:
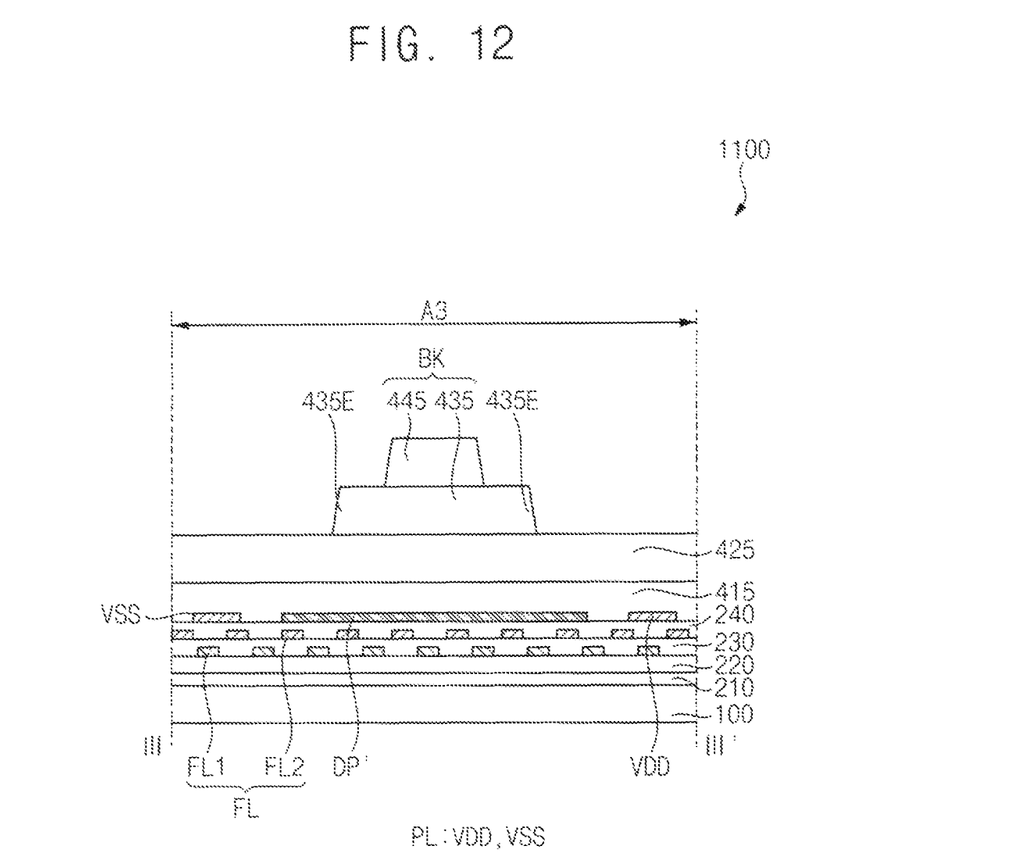

FIGS. 11 and 12 are cross-sectional views illustrating a display device according to some embodiments.

Referring to FIGS. 11 and 12, a description of the display device 1100 according to some embodiments of the present invention overlapping with the display device 1000 according to some embodiments described with reference to FIG. 3 may be omitted.

According to some embodiments, a dummy pattern DP' may be located between the first organic layer 415 and the second organic layer 425 in the peripheral area SA. The dummy pattern DP' may be formed substantially simultaneously or concurrently with the second connection electrode 350 and may include the same (or substantially the same) material.

For example, the plurality of power lines PL may be located between the first organic layer 415 and the second organic layer 425. According to some embodiments, the plurality of power lines PL may be located between the second interlayer insulation layer 240 and the first organic layer 415.

According to some embodiments, the dummy pattern DP' may be located between the plurality of power lines PL. For example, the dummy pattern DP' may be located between the first power line VDD and the second power line VSS. The dummy pattern DP' may be spaced apart from the plurality of power lines PL in a plan view. The dummy pattern DP' may be electrically floating. The dummy pattern DP' may include substantially the same material as the plurality of power lines PL.

According to some embodiments, the dummy pattern DP' may overlap the end portion 435E of the third organic layer 435. For example, at least a portion of the dummy pattern DP' may not overlap the third organic layer 435.

Even if a crack occurs along an edge of the third organic layer 435 adjacent to the display area DA, the dummy pattern DP' may prevent the plurality of fan-out lines FL from being corroded. Because the display device 1100 includes the dummy pattern DP', the display quality of the display device 1100 may be improved.

The display devices according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims, and their equivalents.

What is claimed is:

1. A display device comprising:
a substrate including a display area, a bending area spaced apart from the display area, and a peripheral area between the display area and the bending area;
a dummy pattern on the substrate in the peripheral area;
a bank on the dummy pattern in the peripheral area and exposing a portion of the dummy pattern; and
a light emitting diode on the substrate in the display area.

2. The display device of claim 1, wherein the bank covers another portion of the dummy pattern.

3. The display device of claim 1, wherein the dummy pattern overlaps an edge of the bank adjacent to the display area.

4. The display device of claim 1, wherein the dummy pattern is electrically floating.

5. The display device of claim 1, further comprising:
a first organic layer between the substrate and the bank; and
a second organic layer between the first organic layer and the bank, and
wherein the bank covers the first organic layer and the second organic layer.

6. The display device of claim 5, wherein the second organic layer covers the first organic layer.

7. The display device of claim 5, wherein the dummy pattern is under the first organic layer and contacts the first organic layer.

8. The display device of claim 5, wherein the dummy pattern is between the first organic layer and the second organic layer.

9. The display device of claim 5, wherein the light emitting diode includes a pixel electrode, an intermediate layer on the pixel electrode, and a common electrode on the intermediate layer, and
the display device further comprising:
a first connection electrode between the substrate and the light emitting diode;
a first via insulation layer on the first connection electrode;
a second connection electrode on the first connection electrode;
a second via insulation layer between the second connection electrode and the pixel electrode; and
a pixel defining layer on the pixel electrode and exposing a portion of the pixel electrode.

10. The display device of claim 9, wherein the dummy pattern includes a same material as the first connection electrode.

11. The display device of claim 9, wherein the dummy pattern includes a same material as the second connection electrode.

12. The display device of claim 9, wherein the first organic layer includes a same material as the first via insulation layer.

13. The display device of claim 9, wherein the second organic layer includes a same material as the second via insulation layer.

14. The display device of claim 9, wherein the bank includes,
- a third organic layer including a same material as the pixel defining layer; and
- a fourth organic layer on the third organic layer.

15. The display device of claim 1, wherein the bank extends from the peripheral area to the bending area and has an island shape.

16. The display device of claim 1, further comprising:
- a plurality of power lines crossing the bending area and the peripheral area and configured to transmit a driving voltage to the display area, and
- wherein the bank is between the plurality of power lines in a plan view.

17. The display device of claim 16, wherein the dummy pattern is spaced apart from the plurality of power lines in a plan view.

18. The display device of claim 16, wherein the dummy pattern includes a same material as the plurality of power lines.

19. The display device of claim 1, further comprising:
- a plurality of fan-out lines crossing the bending area and the peripheral area and connected to the display area, and
- wherein the bank is on the plurality of fan-out lines.

20. The display device of claim 19, wherein the dummy pattern overlaps at least one of the plurality of fan-out lines.

* * * * *